United States Patent
Rumer et al.

(10) Patent No.: US 6,892,927 B2
(45) Date of Patent: May 17, 2005

(54) METHOD AND APPARATUS FOR BONDING A WIRE TO A BOND PAD ON A DEVICE

(75) Inventors: Christopher L. Rumer, Chandler, AZ (US); Gregory S. Clemons, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 10/423,117

(22) Filed: Apr. 24, 2003

(65) Prior Publication Data

US 2004/0211761 A1 Oct. 28, 2004

(51) Int. Cl.[7] .................. B23K 37/00; B23K 1/06; B23K 5/20; B23K 20/10; B23K 31/02
(52) U.S. Cl. .................. 228/110.1; 228/180.5; 228/230; 228/4.5; 219/121.6; 219/121.85
(58) Field of Search .................. 228/110.1, 180.5, 228/232, 229, 230, 4.5, 5.1, 6.2; 219/121.6, 121.78, 121.85

(56) References Cited

U.S. PATENT DOCUMENTS

| | | | | |
|---|---|---|---|---|
| 4,534,811 A | * | 8/1985 | Ainslie et al. ............ 156/73.1 |
| 5,079,070 A | * | 1/1992 | Chalco et al. ............ 428/209 |
| 5,251,805 A | * | 10/1993 | Tani et al. ............ 228/180.5 |
| 5,298,715 A | * | 3/1994 | Chalco et al. ......... 219/121.64 |
| 5,495,667 A | * | 3/1996 | Farnworth et al. ............ 29/843 |
| 6,478,212 B1 | * | 11/2002 | Engel et al. ............ 228/5.7 |
| 6,520,399 B1 | * | 2/2003 | Salzer et al. ............ 228/110.1 |
| 6,715,660 B2 | * | 4/2004 | Seki et al. ............ 228/8 |
| 6,729,528 B2 | * | 5/2004 | Seki et al. ............ 228/8 |

FOREIGN PATENT DOCUMENTS

| JP | 59172732 A | * | 9/1984 |
|---|---|---|---|
| JP | 63078543 A | * | 4/1988 |

* cited by examiner

*Primary Examiner*—Colleen P. Cooke
(74) *Attorney, Agent, or Firm*—Blakely, Sokoloff, Taylor & Zafman LLP

(57) ABSTRACT

A method of bonding a wire to a bond pad on an electronic or photonic device is provided. A section of the wire is held within a bond head of the wirebonding apparatus. A laser beam is directed onto the bond pad. Energy of the laser beam heats the bond pad to the temperature that is higher than the temperature of the device. The bond head is subsequently moved toward the device to bring a portion of the wire into contact with the bond pad. Ultrasonic energy is provided to an interface between the portion of the wire and the bond pad.

16 Claims, 3 Drawing Sheets

METHOD AND APPARATUS FOR BONDING A WIRE TO A BOND PAD ON A DEVICE

BACKGROUND OF THE INVENTION

1). Field of the Invention

This invention relates to a method and apparatus for bonding a wire to a bond pad on a device, such as an electronic or a photonic device.

2). Discussion of Related Art

Electronic and photonic devices usually have a number of bond pads on upper surfaces thereof that are connected to bond pads on package substrates or other devices for purposes of providing electronic signals to and from the electronic or photonic devices.

A common technique for interconnecting such bond pads is wirebonding. A portion of a wire is held against a bond pad, and ultrasonic energy is provided through an ultrasonic bond head to an interface between the portion of the wire and the bond pad. Such energy by itself is usually insufficient to fuse the wire to the bond pad. The electronic device is usually heated to approximately 180° C. by a substrate workholder during the bonding process. Heat energy from the workholder supplements the ultrasonic energy, and the combination of the heat energy and ultrasonic energy is sufficient to fuse the wire to the bond pad.

Several electronic and photonic devices will be damaged at high temperatures, and often require processing conditions much below the 180° C. to which a device has to be heated for purposes of ultrasonic bonding. The maximum temperatures for some integrated circuit packages having certain thin films may, for example, be below 100° C. Ultrasonic bonding at such low temperatures is usually not possible. Ultrasonic bonding of gold wires to aluminum-capped wirebond pads at temperatures below 125° C., for example, is generally not possible.

BRIEF DESCRIPTION OF THE DRAWINGS

The invention is described by way of example with reference to the accompanying drawings, wherein.

DETAILED DESCRIPTION OF THE INVENTION

Figure 1:
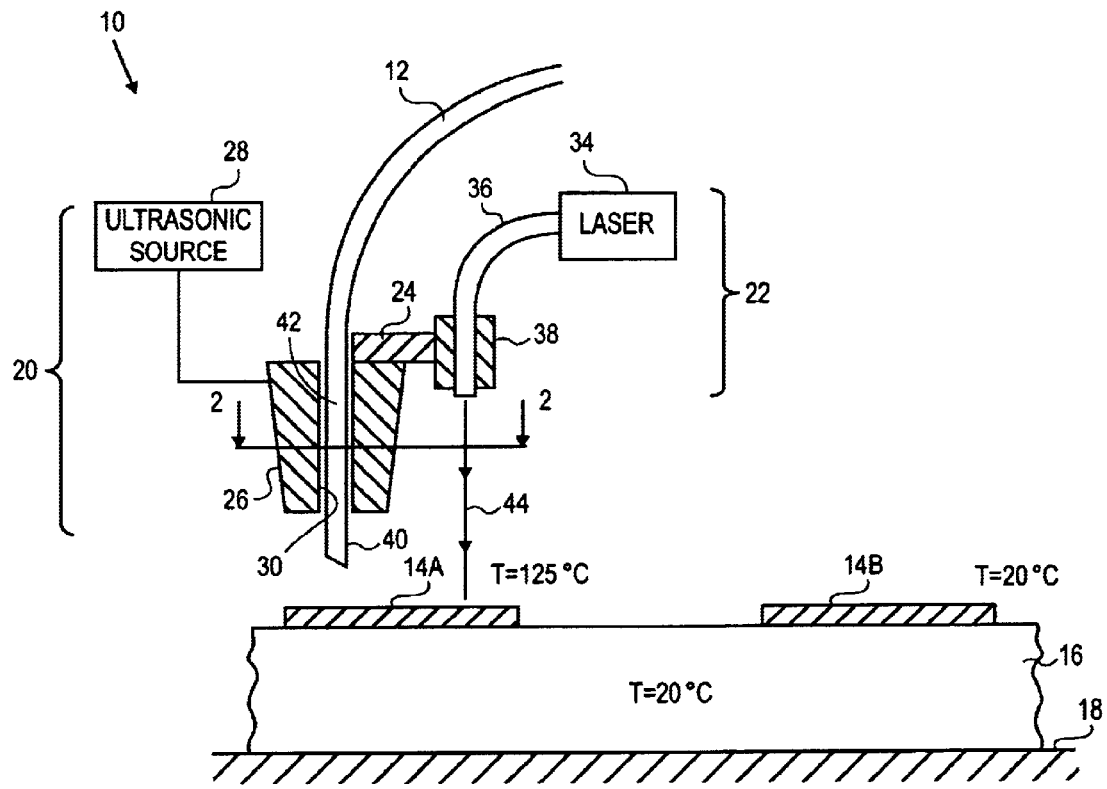
FIG. 1 is a cross-sectional side view illustrating a wirebonding apparatus for carrying out a wirebonding method, according to an embodiment of the invention.

FIG. 1 of the accompanying drawings illustrates a wirebonding apparatus 10 used for bonding wires 12 to bond pads 14A and 14B on an electronic or photonic device 16, according to an embodiment of the invention. The wirebonding apparatus 10 includes a holder 18 for the device 16, ultrasonic bonding apparatus 20, and laser heating apparatus 22.

One skilled in the art will appreciate that some of the components illustrated in FIG. 1 are conventional to a wirebonding apparatus. A typical wirebonding apparatus also includes a frame and many other components that move relative to one another to, for example, feed wire, cut wire, etc. Such components are not discussed in detail herein, so as not to obscure the invention. For example, FIG. 1 illustrates a holder 18 and a component 24. The holder 18 and the component 24 are both mounted to a frame, and the frame is configured to allow for vertical movement of the component 24 toward and away from the holder 18. The exact configuration of the frame, its actuators, etc., are beyond the scope of this invention.

The ultrasonic bonding apparatus 20 includes an ultrasonic bond head 26 and an ultrasonic source 28 connected to the ultrasonic bond head 26. The ultrasonic bond head 26 is mounted to the component 24 so as to be movable together with the component 24 when the component 24 moves vertically toward and away from the holder 18. The ultrasonic bond head 26 has a passage 30 extending vertically therethrough.

The ultrasonic source 28, when energized, can provide an alternating voltage to the ultrasonic bond head 26 at ultrasonic frequencies. Ultrasonic energy is thereby provided from the ultrasonic source 28 to the ultrasonic bond head 26.

The laser heating apparatus 22 includes a soft beam laser 34, an optic fiber 36, and an alignment piece 38.

The alignment piece 38 is secured to the component 24. The alignment piece 38 can move together with the component 24 and the ultrasonic bond head 26 in a vertical direction toward and away from the holder 18.

The optic fiber 36 has an end that is inserted and held in alignment within a passage that extends through the alignment piece 38. The end of the optic fiber 36 held by the alignment piece 38 points vertically downward. An opposing end of the optic fiber 36 is connected to the laser 34. The laser 34 is typically mounted in a stationary position relative to the holder 18, and movement of the alignment piece 38 relative to the laser 34 is allowed for due to flexibility of the optic fiber 36.

In use, the electronic or photonic device 16 is located on an upper horizontal surface of the holder 18. An end 40 of one of the wires 12 is fed through the passage 30 in the ultrasonic bond head 26, and a section 42 of the wire 12 is held and aligned by the passage 30. The ultrasonic source 28 and the laser 34 are at this stage still switched off. The electronic or photonic device 16 and the bond pads 14A and 14B are at the same temperature, for example, 20° C. The component 24 is moved in horizontal x- and y-directions, so that the free end of the optic fiber 36 and the end 40 of the wire 12 are moved so that they are simultaneously in positions over the bond pad 14A.

Figure 2:
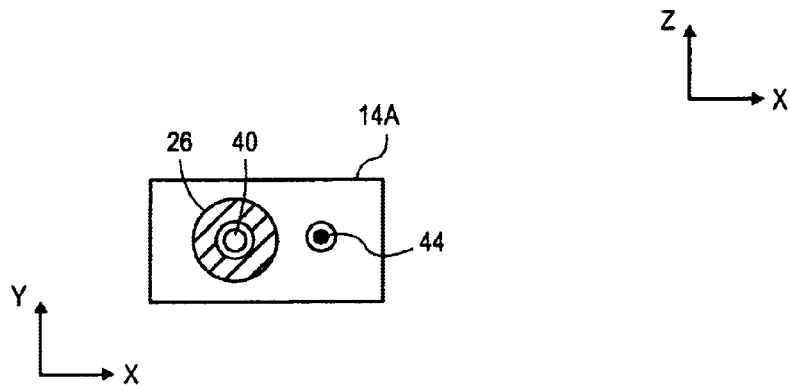
FIG. 2 is a cross-sectional plan view on 2—2 in FIG. 1, illustrating the location of a laser beam that is used to heat a bond pad.

The laser 34 is then switched on, or energized, and a laser beam 44 is emitted thereby, which propagates through the optic fiber 36, is emitted by the free end of the optic fiber 36, held by the alignment piece 38, and then propagates through air onto the bond pad 14A. FIG. 2 illustrates the location at which the laser beam 44 strikes the bond pad 14A on the right-hand side of the bond pad 14A, and the position of the end 40 of the wire 12 above the left-hand side of the bond pad 14A.

The laser beam may also be focused closer to the bond location or directly at the wire to pad interface. The laser pad heating and ultrasonic wirebonding could be done in parallel (the laser is on during the wirebond fusion). Substrate pad heating may also be required (not just the die pad), since the entire package will be at a lower temperature.

Energy from the laser beam 44 causes localized heating of the bond pad 14A, so that a temperature of the bond pad 14A increases from 20° C. to approximately 125° C., while a majority (e.g., at least 99%) of the electronic or photonic device 16 and the other bond pad 14B remain at 20° C. The temperature of 125° C. to which the bond pad 14A is heated is sufficiently high to allow for subsequent ultrasonic bonding of the wire 12 to the bond pad 14A. Such a high temperature could, however, cause damage to circuitry or photonics of the electronic or photonic device 16. Localized heating of the bond pad 14A, however, avoids damage to electronics or photonics of the device 16. In other embodiments, the temperature of the bond pad 14A may increase to between 100° C. and 150° C. In other embodiments, the temperature of the bond pad 14A may be at least 50° C. more than the temperature of the electronic or photonic device 16. In other embodiments, the electronic or photonic device 16 is preferably always below 50° C.

The laser beam 44 preferably has an energy density of between 10 and 100 mJ/cm$^2$. Such an energy density is sufficiently low to cause gentle heating of the bond pad 14A. The laser beam may have a wavelength of between 1.06 $\mu$m ($CO_2$ laser) to 10 $\mu$m (Seed ND:YAG laser). In order to heat a 50 $\mu$m by 60 $\mu$m aluminum-capped wirebond pad, the beam 44 would be a continuous wave expanded and sent through a mask to produce a final spot size of approximately 50 $\mu$m in diameter. The process time would be less than 200 ms, and the energy density would be approximately 50 mJ/cm$^2$.

Figure 3:
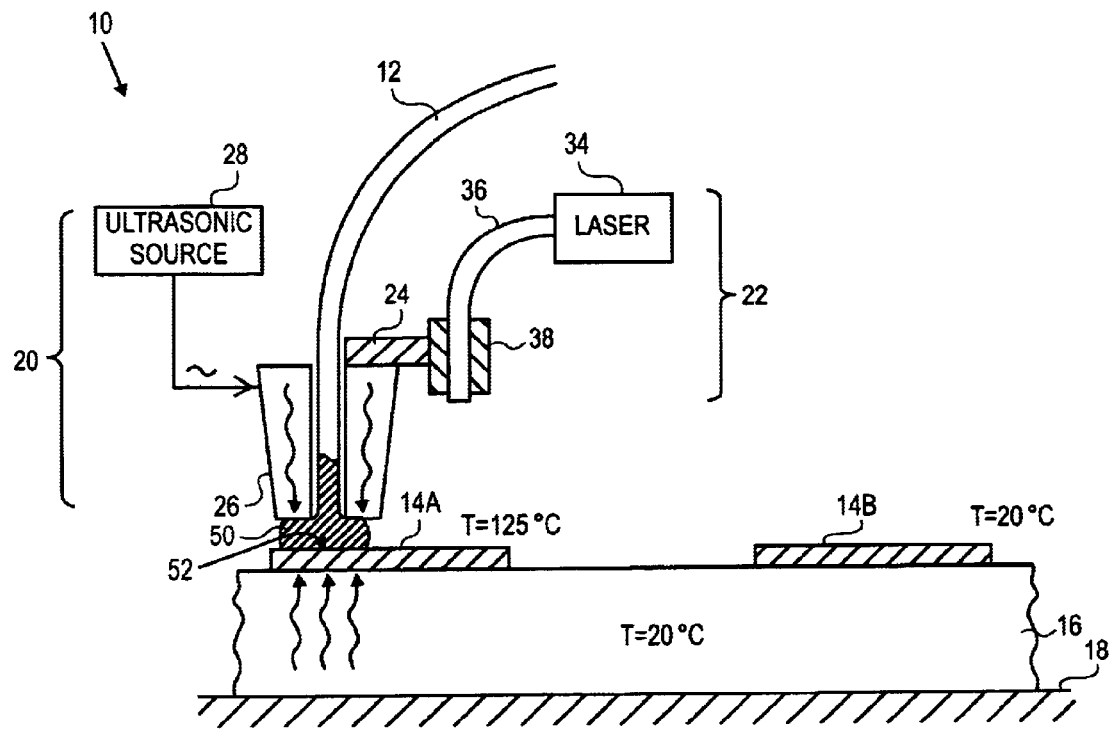
FIG. 3 is a view similar to FIG. 1, illustrating the use of an ultrasonic bonding apparatus to bond a wire to the bond pad which has been heated with the laser beam.

The laser beam 44 is subsequently switched off. As illustrated in FIG. 3, the component 24, together with the ultrasonic bond head 26, and the alignment piece 38, are subsequently moved downward toward the electronic or photonic device 16. The end (40 in FIG. 1) of the wire 12 is deformed between opposing surfaces of the ultrasonic bond head 26 and the bond pad 14A to form a metal mass 50. In another embodiment, the wire 12 may be deformed into the different shape or may not be deformed at all. An interface 52 is created between the metal mass 50 of the wire 12 and the bond pad 14A.

The ultrasonic source 28 is then switched on, or energized, so that ultrasonic energy is provided thereby to the ultrasonic bond head 26. The ultrasonic energy is transmitted from the ultrasonic bond head 26 to the interface 52. The ultrasonic energy provided to the interface 52 by itself is generally insufficient to fuse the metal mass 50 to the bond pad 14A. However, heat energy provided by the heated bond pad 14A supplements the ultrasonic energy to fuse the metal mass 50 to the bond pad 14A at the interface 52. The ultrasonic source 28 is then switched off.

Figure 4:
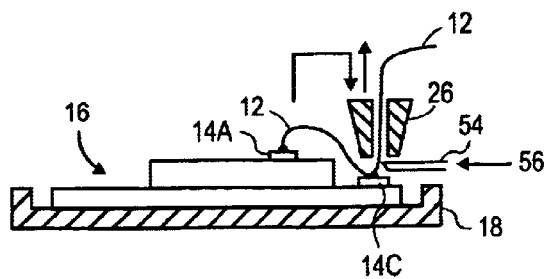
FIG. 4 is a cross-sectional side view, illustrating bonding of the wire at a secondary bond pad.

As illustrated in FIG. 4, the ultrasonic bond head 26 is then moved sequentially upward in a z-direction, sideways in an x-direction, and downward in the z-direction to another bond pad 14C. The wire 12 is then attached to the bond pad 14C, so as to interconnect the bond pads 14A and 14C. A blade 54 is then used to sever the wire 12 in a direction 56. Thereafter, a new free end of the wire 12 is held by the ultrasonic bond head 26.

Figure 5:
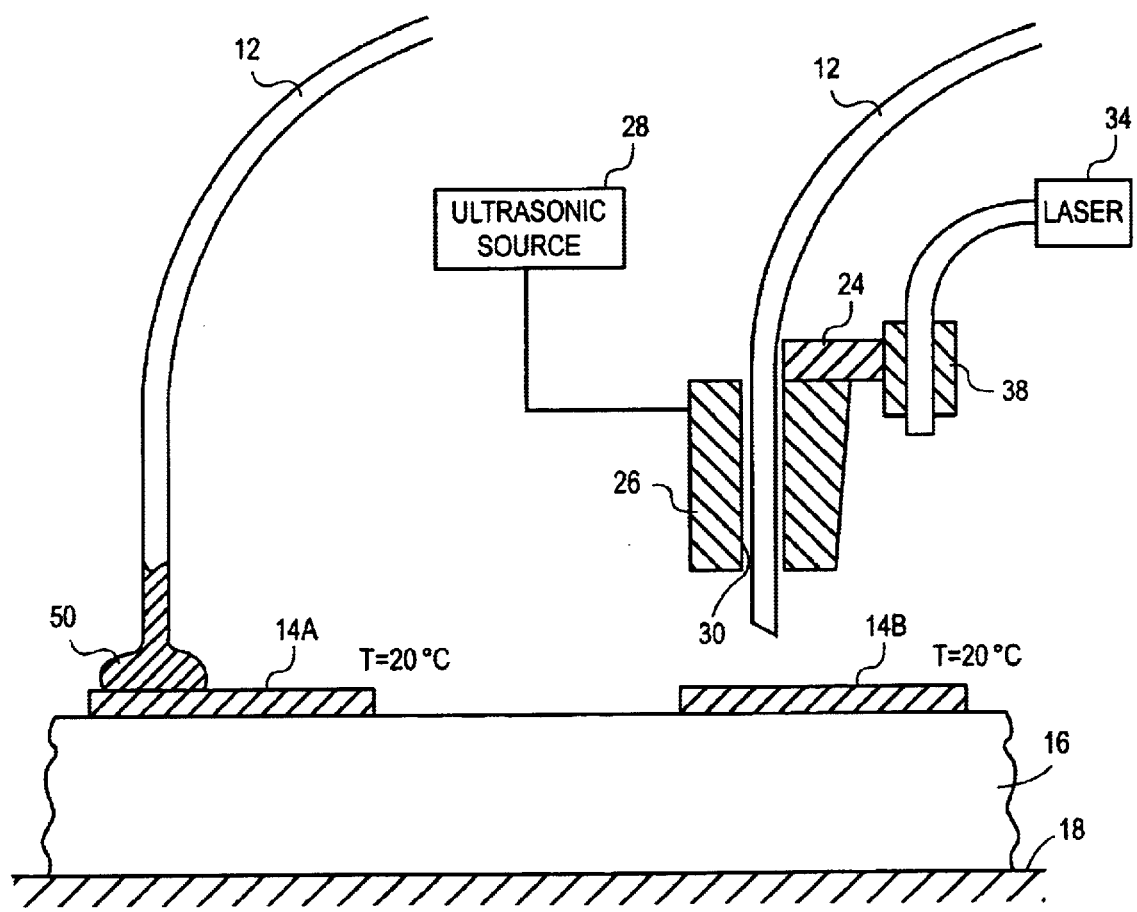
FIG. 5 is a view similar to FIG. 3, illustrating the apparatus after the wire has been severed and a free end of the wire is moved into a position to attach a free end of the wire to a further bond pad.

As illustrated in FIG. 5, the newly created free end of the wire 12 may then be moved into a position over the bond pad 14B. The process, illustrated with reference to FIGS. 1, 2, and 3 for attaching the wire 12 to the bond pad 14A may be repeated to attach the wire 12 to the bond pad 14B.

It can thus be seen that wires 12 can be bonded to the bond pads 14A, 14B, and 14C using an ultrasonic bonding apparatus 20 without heating the electronic or photonic device 16 to temperatures that may cause damage to electronics and photonics thereof. The laser heating apparatus 22 provides fast (less than 200 ms), localized (50 $\mu$m beam) heating of the bond pads 14A, 14B, and 14C to facilitate ultrasonic bonding.

Although ultrasonic bonding has been described, by way of example, using a ball bonding process, one skilled in the art will appreciate that the invention may be applied with minor modification to other wirebonding processes such as wedge bonding, reverse bonding, stud bump bonding, etc.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of bonding a wire to a bond pad on a device, comprising:

directing a laser beam onto the bond pad; and providing ultrasonic energy to an interface between a portion of the wire and the bond pad, wherein the laser beam is focused at a location spaced from where the wire contacts the bond pad.

2. The method of claim 1, wherein the temperature of the bond pad is increased to between 100° C. and 150° C.

3. The method of claim 1, wherein the temperature of the bond pad is at least 50° C. more than the temperature of the device.

4. The method of claim 1, wherein the laser beam heats the bond pad before the portion of the wire is brought into contact with the bond pad.

5. The method of claim 1, wherein the bond pad is heated while the wire is bonded.

6. The method of claim 1, wherein the laser beam is focused at a location where the wire contacts the bond pad.

7. The method of claim 1, wherein the laser beam has an energy density of between 10 and 100 mJ/cm$^2$.

8. A method of bonding a wire to a bond pad on a device, comprising:

energizing a heating source to provide heating energy; and energizing an ultrasonic source, different from the heating source, to provide ultrasonic energy to an interface between the bond pad and a portion of the wire, the heating energy increasing the temperature of the bond pad to between 100° C. and 150° C. and supplementing the ultrasonic energy to locally heat an interface between the bond pad and the wire with respect to a remainder of the device, and bond the wire to the bond pad.

9. The method of claim 8, wherein the heating energy heats the bond pad.

10. A method of bonding a wire to a bond pad on a device, comprising:

holding a section of the wire within a bond head of a wirebonding apparatus;

directing a laser beam onto the bond pad, energy of the laser beam heating the bond pad to the temperature that is higher than the temperature of the device;

moving the bond head toward the device to bring a portion of the wire into contact with the bond pad, wherein the laser beam is focused at a location spaced from where the wire contacts the bond pad; and providing ultrasonic energy to an interface between the portion of the wire and the bond pad.

11. The method of claim 10, wherein the ultrasonic energy is transmitted in waves that propagate through the bond head to the interface.

12. The method of claim 10, wherein the energy of the laser and the ultrasonic energy cause faster diffusion between the portion of the wire and the bond pad than the ultrasonic energy alone.

13. The method of claim 10, wherein the laser beam heats the bond pad before the portion of the wire is brought into contact with the bond pad.

14. An apparatus for bonding a wire to a bond pad on a device, comprising:

a holder for the device;

a mounting structure that is movable relative to the holder;

a laser source having a laser emitter, mounted to the mounting structure for movement relative to the holder upon movement of the mounting structure relative to the holder, positioned to direct a laser beam onto the bond pad to heat the bond pad to the temperature above the temperature of the device;

a bond head, mounted to the mounting structure for movement together with the laser emitter, having a passage for holding a section of wire and being movable by the mounting structure relative to the holder to move a portion of the wire into contact with the bond pad when the device is held by the holder; and an ultrasonic source providing ultrasonic energy to the bond head.

15. The apparatus of claim 14, wherein the energy of the laser and the ultrasonic energy cause faster diffusion between the portion of the wire and the bond pad than the ultrasonic energy alone.

16. The apparatus of claim 14, wherein the laser beam has a focal point on the bond pad when the portion is distant from the bond pad.

* * * * *